United States Patent
Tigelaar

(10) Patent No.: US 7,410,840 B2
(45) Date of Patent: Aug. 12, 2008

(54) BUILDING FULLY-DEPLETED AND BULK TRANSISTORS ON SAME CHIP

(75) Inventor: Howard Lee Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 309 days.

(21) Appl. No.: 11/091,078

(22) Filed: Mar. 28, 2005

(65) Prior Publication Data

US 2006/0216903 A1    Sep. 28, 2006

(51) Int. Cl.
*H01L 21/84* (2006.01)
(52) U.S. Cl. ............ 438/153; 438/977; 257/E21.642
(58) Field of Classification Search .......... 438/152, 438/153, 222, 226; 257/E21.642, E21.704
See application file for complete search history.

(56) References Cited

U.S. PATENT DOCUMENTS

| 5,740,099 | A   | * | 4/1998  | Tanigawa ............... 365/51 |
| 6,214,694 | B1  | * | 4/2001  | Leobandung et al. ....... 438/413 |
| 6,531,754 | B1  | * | 3/2003  | Nagano et al. ............ 257/510 |
| 2004/0180478 | A1 |   | 9/2004  | Yang et al. |
| 2004/0217420 | A1 |   | 11/2004 | Yeo et al. |
| 2004/0217775 | A1 |   | 11/2004 | Turner |

OTHER PUBLICATIONS

U.S. Appl. No. 11/091,249, filed Mar. 28, 2005, Tigelaar.

* cited by examiner

*Primary Examiner*—Chandra Chaudhari
(74) *Attorney, Agent, or Firm*—Wade J. Brady, III; Frederick J. Telecky, Jr.

(57) ABSTRACT

A method (10) of forming fully-depleted silicon-on-insulator (FD-SOI) transistors (150) and bulk transistors (152) on a semiconductor substrate (104) as part of an integrated circuit fabrication process is disclosed.

18 Claims, 4 Drawing Sheets

BUILDING FULLY-DEPLETED AND BULK TRANSISTORS ON SAME CHIP

FIELD OF INVENTION

The present invention relates generally to semiconductor devices and more particularly to fabricating fully-depleted and bulk SOI devices in an integrated circuit fabrication process.

BACKGROUND OF THE INVENTION

Semiconductor device geometries have dramatically decreased in size since such devices were first introduced several decades ago. The desire for higher performance circuits has driven the development of high-speed sub-100 nanometer (nm) silicon-on-insulator (SOI) complementary metal-oxide-semiconductor (CMOS) technology. In SOI technology, metal-oxide semiconductor field-effect transistors (MOSFETs) are formed on a thin layer of silicon overlying a layer of insulating material such as silicon oxide. Devices formed on SOI offer many advantages over their bulk counterparts. For example, SOI devices generally have a reduced junction capacitance, little to no reverse body effect, soft-error immunity, full dielectric isolation, and little to no latch-up. SOI technology therefore enables higher speed performance, higher packing density, and reduced power consumption, among other things, as compared to conventional transistors that are formed on a semiconductor bulk material (e.g., silicon) and not over a layer of insulating material.

One type of SOI device is a fully-depleted (FD-SOI) device. In a FD-SOI device the thin layer of silicon has a thickness that is less than the maximum depletion layer width in the silicon during device operation. Consequently, during operation, the FD-SOI experiences a "full" depletion thereof. FD-SOI devices have an additional advantage over traditional or bulk transistors in that they can be scaled to shorter gate lengths and do not suffer from body effects due to the fact that the body is fully-depleted during device operation. FD-SOI devices are also believed to provide lower off-state leakage currents, higher speeds, fewer soft errors, lower operating voltages and lower gate delay than regular non-SOI transistors.

However, since FD-SOI devices are formed on a thin layer of silicon overlying a layer of insulating material, they can be said to lack a "body tie", or rather a connection to the underlying semiconductor substrate. This makes it very difficult to produce different types of transistors on the same chip and/or the same or similar types of transistors that have different operating characteristics from being produced on the same chip. For example, multiple transistors having different threshold voltages (Vt's) and/or operating speeds would be difficult to be produced at the same time. Likewise, it would be difficult to produce high voltage I/O transistors while low voltage I/O transistors are also produced. Bulk transistors, on the other hand, do allow such different transistors to be made at the same time. More particularly, since these more traditional transistors are formed on bulk semiconductor material (e.g., silicon) that does not overlie a layer of insulating material, they can be said to have a "body tie". Essentially, the thicker substrate that the transistors are formed on can accommodate different types of processing, such as different doping concentrations, for example, that enable different devices to be formed on the same chip.

Consequently, it would be desirable to be able to reliably form both FD-SOI and bulk transistors in a single fabrication process so that either of the devices can be employed based on circuit application requirements.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming fully-depleted silicon-on-insulator (FD-SOI) and bulk transistor devices in an integrated circuit fabrication process. Forming the different types of transistors on the same semiconductor substrate allows different circuit application requirements to be met. For example, FD-SOI transistors can be used where speed and low threshold voltages (Vt's) are important. Likewise, bulk transistors can be used where high voltage I/O, low voltage I/O and/or multiple transistors having different Vt's are needed. Capacitors can also be built from a layer of polysilicon and the substrate. Similarly, resistors can be built in the substrate and bipolar transistors can also be fabricated.

According to one or more aspects of the present invention, a method of forming a fully-depleted silicon-on-insulator (FD-SOI) transistor and a bulk transistor as part of an integrated circuit fabrication process is disclosed. The method includes providing a silicon-on-insulator (SOI) substrate which comprises a layer of silicon material formed over a layer of insulating material which is in turn formed over a semiconductor substrate. A layer of oxide material is formed over the layer of silicon material and a layer of nitride material is formed over the layer of oxide material. The layer of nitride material, the layer of oxide material, the layer of silicon material and at least some of the layer of insulating material are patterned to establish bulk regions wherein bulk transistors can be formed, and where the bulk regions separate the layer of silicon into silicon regions wherein fully depleted transistors can be formed. The layer of nitride material is removed and an epitaxial material is grown in the bulk regions. The layer of oxide material is removed and the silicon regions are thinned by growing a layer of oxide material which consumes silicon as part of the growth process. The grown layer of oxide material is removed to reveal the thinned silicon regions. A fully depleted transistor is then formed in a thinned silicon region and a bulk transistor is formed in a bulk region.

According to one or more other aspects of the present invention, an integrated circuit is disclosed that includes a fully depleted transistor and a bulk transistor formed on a single semiconductor substrate. The fully depleted and bulk transistors are formed as part of an integrated circuit fabrication process, where the fully depleted transistor is formed within a silicon-on-insulator (SOI) region of the semiconductor substrate and the bulk transistor is formed within a bulk region of the semiconductor substrate.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the follow-

DESCRIPTION OF THE INVENTION

Figure 1:
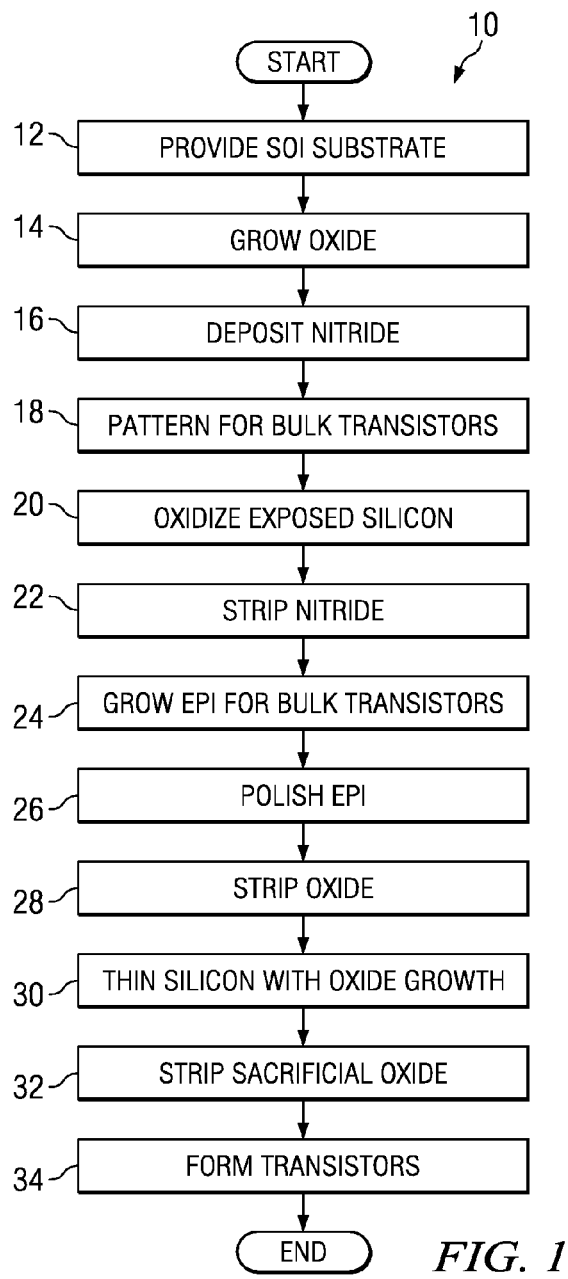
FIG. 1 is a flow diagram illustrating an exemplary method for forming fully-depleted silicon-on-insulator (FD-SOI) and bulk transistor devices in an integrated circuit fabrication process according to one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Turning to FIG. 1, an exemplary methodology 10 is illustrated for forming fully-depleted silicon-on-insulator (FD-SOI) and bulk transistor devices in an integrated circuit fabrication process according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
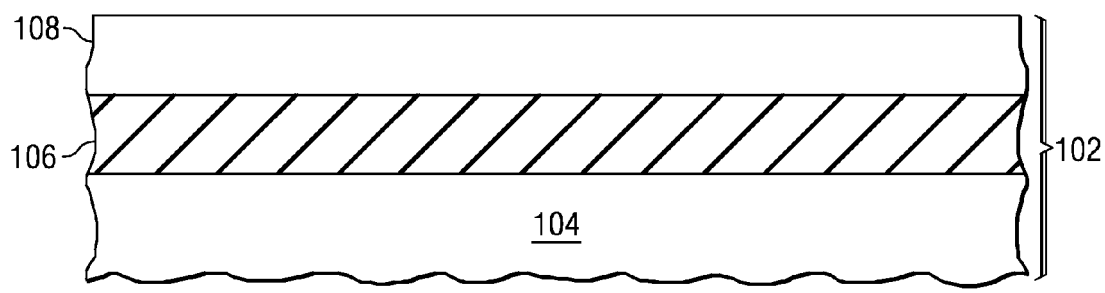
FIGS. 2-11 are fragmentary cross sectional diagrams illustrating the formation of exemplary fully-depleted silicon-on-insulator (FD-SOI) and bulk transistor devices in an integrated circuit fabrication process according to one or more aspects of the present invention, such as the methodology set forth in FIG. 1.

The method 10 begins at 12, wherein a SOI starting material 102 is provided (FIG. 2). The SOI starting material comprises a semiconductor substrate 104 over which a layer of nonconductive insulating material 106 is formed, and having a thin layer of silicon 108 formed over the layer of insulating material 106 (FIG. 2). The layer of insulating material 106 may comprise a buried oxide layer (BOX), for example. Similarly, the semiconductor substrate 104 may comprise any type of semiconductor body (e.g., formed of silicon or SiGe) such as a semiconductor wafer or one or more die on a wafer, as well as any other type of semiconductor layers associated therewith. By way of example, the layer of silicon 108 can have a thickness of between around 800 Angstroms and around 1200 Angstroms.

Figure 3:
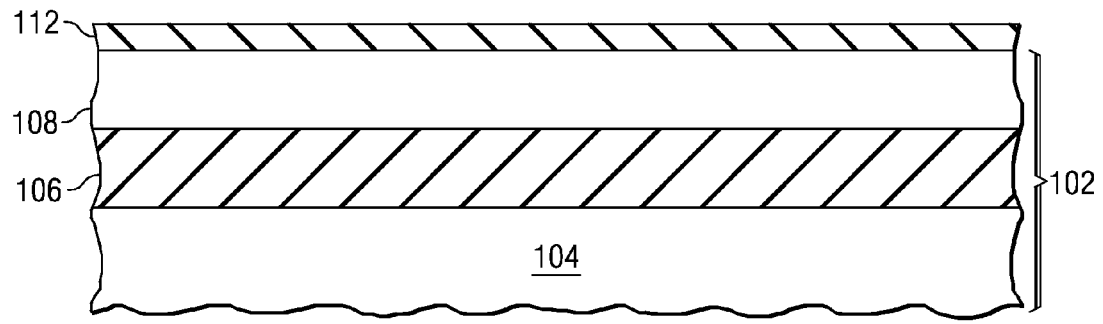
Figure 4:
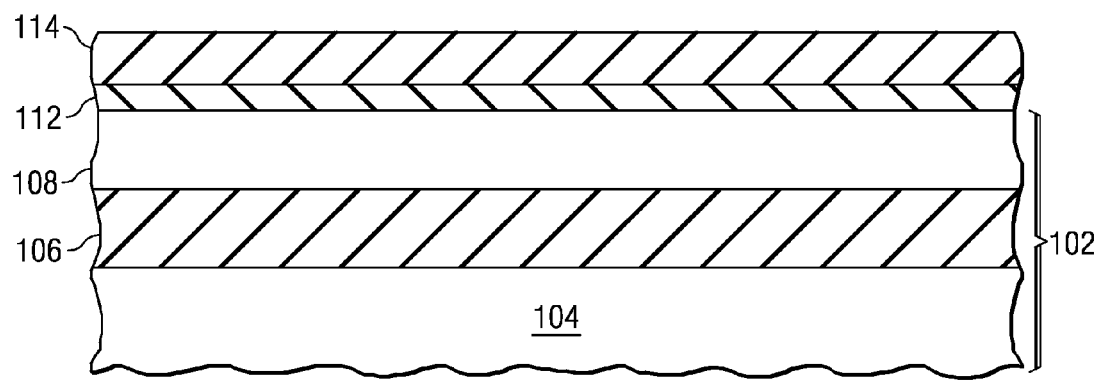

At 14, a thin layer of oxide based material 112 is grown over the layer of silicon 108 (FIG. 3). The layer of oxide material 112 can be formed to a thickness of around 50 to 200 Angstroms, for example. A layer of nitride based material 114 is then deposited over the layer oxide 112 at 16 (FIG. 4). The layer of nitride material 114 can be formed to thickness of between around 700 Angstroms and around 1200 Angstroms, for example.

Figure 5:
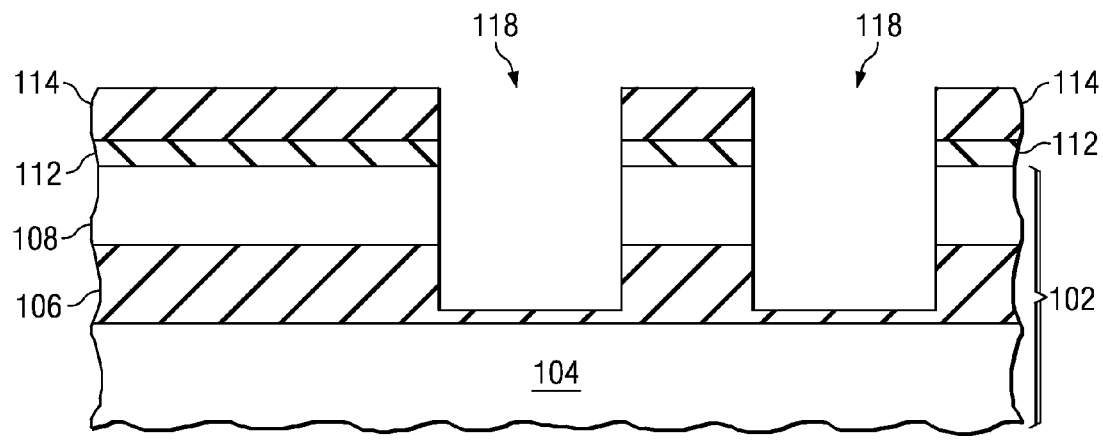

The layer of nitride material 114, layer of oxide material 112, layer of silicon 108 and layer of insulating material 106 are then patterned at 18 to establish regions 118 where bulk transistors can be formed in the bulk silicon substrate 104 (FIG. 5). The patterning can be performed in any suitable manner, such as with lithographic techniques, for example, where lithography broadly refers to processes for transferring one or more patterns between various media. In lithography, a light sensitive resist coating (not shown) is formed over one or more layers to which a pattern is to be transferred (e.g., layers 114, 112, 108 and 106). The resist coating is then patterned by exposing it to one or more types of radiation or light which (selectively) passes through an intervening lithography mask containing the pattern. The light causes the exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched) to transfer the pattern thereto. After regions 118 are formed, the resist pattern is removed.

Figure 6:
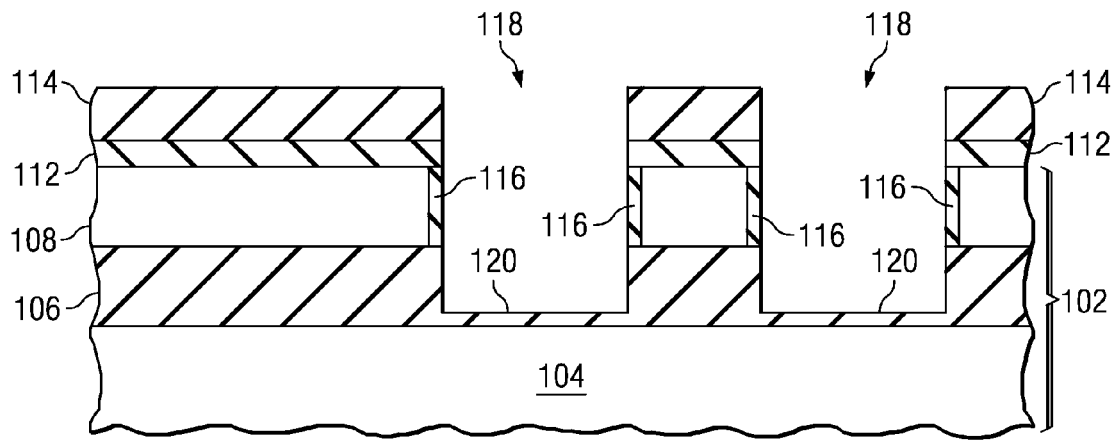

An oxidation activity is then performed at 20 to form an oxide 116 on exposed portions of the layer of silicon 108 on the sidewalls of the regions 118 (FIG. 6). It will be appreciated that the exposed portions of the layer of silicon 108 may be slightly recessed prior to the oxidation at 20, such as by an isotropic gas etch and/or a wet etch, for example. It will also be appreciated that while in the example illustrated, a small amount 120 of the layer of insulating material 106 remains on the surface of the substrate 104 within the regions 118 after the patterning at 18, that all of the layer of insulating material 106 may be removed from the surface of the substrate 104 within the regions 118 during the patterning at 18. In such a situation, a small amount of oxide 120 may grow on the exposed portions of the substrate 104 within the regions 118 during the oxidation at 20.

In any event, the oxidation at 20 may be performed, for example, by placing the layers in an oxidizing furnace and/or depositing oxide, followed by an optional etch to remove residual and/or unwanted amounts of oxide. In addition to removing excess oxide built up on the sidewalls of the regions 118, such an etch may also remove, for example, some of the oxide 120 on the substrate 104 within the regions 118—regardless of whether the oxide 120 is a remnant of layer 106 or is formed during the oxidation at 20. Nevertheless, some oxide is allowed to remain on the exposed portions of the layer of silicon 108 on the sidewalls of the regions 118 as well as on the exposed surface portions of the substrate 104 within the regions 118 so that these areas are protected by the oxide 116, 120 during a subsequent removal of the layer of nitride material 114.

Figure 7:
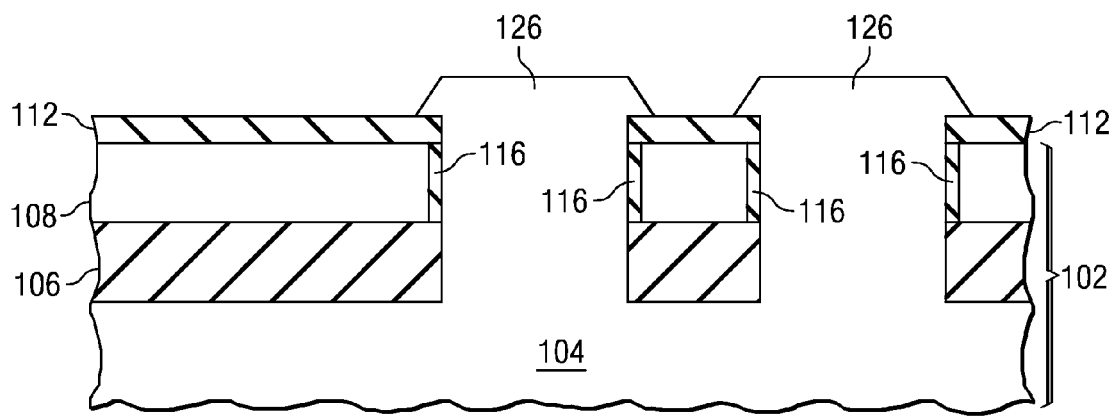

Accordingly, the layer of nitride material 114 is then removed at 22, such as with a hot phosphoric acid solution, for example (FIG. 7). The remaining oxide protects the silicon, for example, which would otherwise be attacked by such a hot phosphoric solution. The nitride removal at 22 may be carefully controlled to also remove the oxide 120 on the substrate 104 within regions 118. Alternatively, the oxide 120 on the substrate 104 within regions 118 (but not on the sidewalls thereof) may be removed by a subsequent etching process (not shown). Once the substrate 104 within regions 118 is exposed, an epitaxial growth process is performed at 24 to fill the regions 118 with an epitaxially grown semiconductor material 126 (FIG. 7). It can be appreciated that growing the oxide at 20 on the sidewall of the regions 118 seals off the layer of silicon 108 to mitigate nucleation of epi growth. This epitaxially grown material 126 provides areas wherein bulk transistors can be formed (e.g., that have a "body tie" to the bulk semiconductor substrate 104). In addition to facilitating the epitaxial growth process, it can be appreciated that removing the oxide 120 from the substrate 104 also removes a barrier that would otherwise prevent transistors formed therein from being "tied" to the body of the semiconductor substrate 104.

Figure 8:
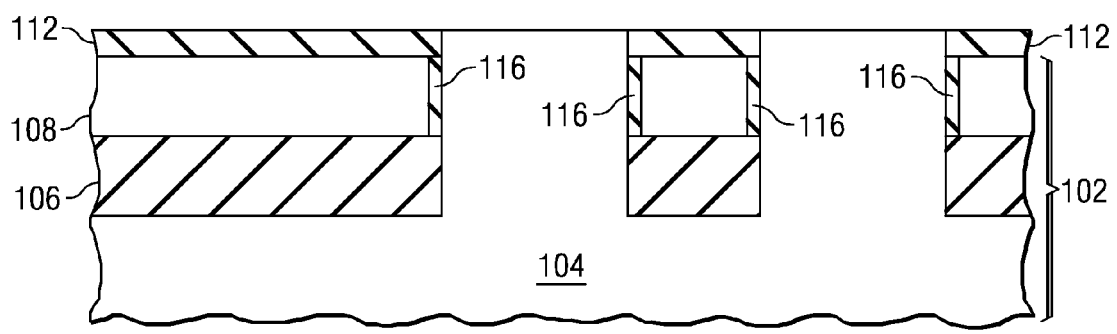
Figure 9:
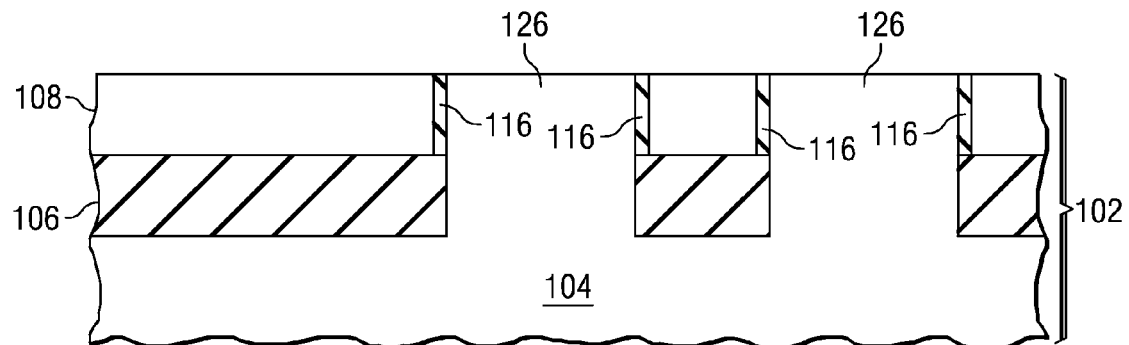

As illustrated in the example presented in FIG. 7, it can be appreciated that some of the epitaxially grown semiconductor material 126 may "mushroom" up out of the regions 118, depending upon the technology used to grow the material 126. As such, an optional polishing activity is performed at 26, such as a chemical mechanical polishing (CMP), for example, to remove any such facets, bumps or other types of discontinuities (FIG. 8). This planarization process makes the epi material 126 in the regions 118 substantially flush with the surrounding layer of oxide material 112. The remaining oxide material 112 is then stripped at 28 so that both the layer of silicon 108 and epi material 126 are revealed (FIG. 9).

Figure 10:
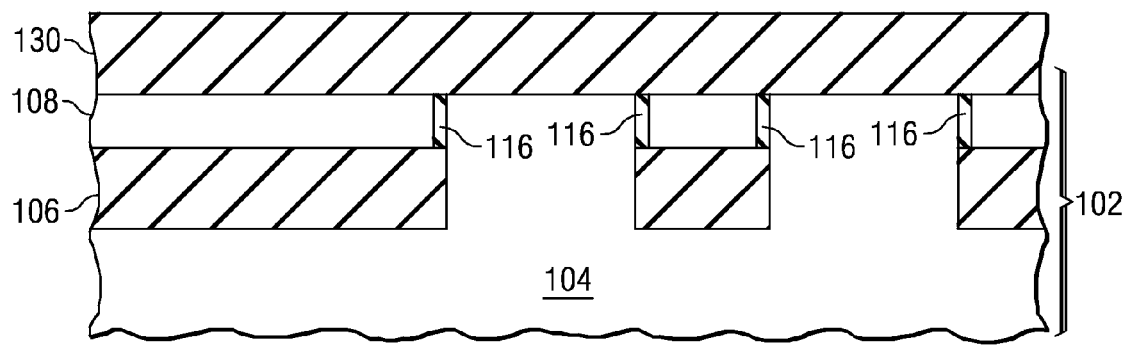
Figure 11:
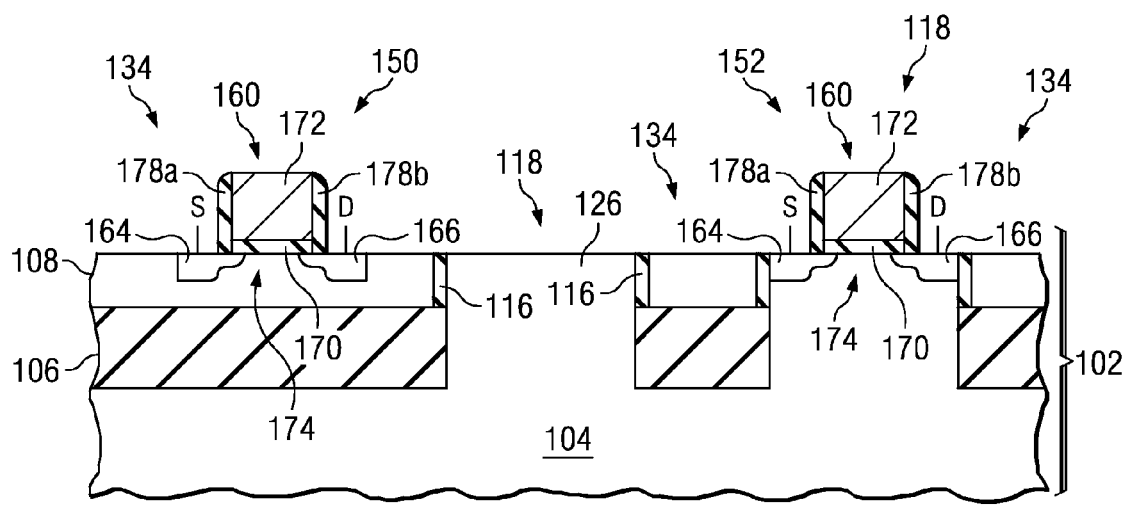

At 30, the layer of silicon 108 is thinned by an oxide growth process which consumes silicon as the layer of oxide 130 is grown (FIG. 10). Incidentally, some of the epi material 126 is also consumed as part of this growth process. This does not, however, adversely affect bulk transistors since the epi material 126 can be said to extend very far or be very thick as it is tied to the semiconductor substrate 104. The grown oxide 130 is then removed at 32, such as by stripping it with a hydrogen fluoride (HF) based agent, for example (FIG. 11). Removing the oxide 130 reveals the thinned layer of silicon 108 wherein the fully depleted transistors can be formed. Since the epi material 126 is also consumed by the grown oxide 130, stripping this oxide leaves the epi material 126 substantially flush with the surrounding thinned layer of silicon 108. By way of example, the layer of silicon 108 can be thinned so that it has a thickness of between around 20 Angstroms and around 40 Angstroms.

At 34, the different transistors can be formed in the different regions (FIG. 11). More particularly, fully-depleted silicon-on-insulator (FD-SOI) transistors can be formed in the regions 134 comprising the thinned silicon 108, while bulk transistors can be formed in the regions 118 comprising the epi material 126. It will be appreciated that while three thinned silicon regions 134 and two epi regions 118 are depicted in the example illustrated, that any suitable number of such regions can be fashioned upon a semiconductor substrate. Similarly, while in the example presented only one FD-SOI transistor 150 is illustrated in a thinned silicon region 134 and only one bulk transistor 152 is illustrated in an epi region 118, any suitable number of transistors can be in the formed in the different regions. The different transistors can be formed by slightly varying certain fabrication processes and/or selectively exposing different parts of the regions to different processes. For example, certain parts of the epi regions 118 can be selectively masked off to receive more or less of one or more types of dopant materials to establish high performance CMOS transistors and/or analog transistors.

Further, it can be seen that the oxide formations 116 grown at 20 may serve to electrically isolate the different regions 118 and 134 (and the devices formed therein) from one another.

Generally speaking, to establish any of the different transistors, a gate structure 160 and source and drain regions 164, 166 are formed (FIG. 11), after which silicide, metallization, and/or other back-end processing (not shown) can be performed. To form the gate structure 160, a thin gate oxide 170 is formed over the upper surface of the silicon and epi regions 134, 118. The gate oxide 170 can be formed by any suitable material formation process, such as thermal oxidation processing, for example. By way of example, the oxide layer 170 can, for example, be formed to a thickness of between about 100 Angstroms and about 500 Angstroms at a temperature of between about 600 degrees Celsius and about 1000 degrees Celsius in the presence of $O_2$. This layer of oxide material 170 can serve as a gate oxide in a high voltage CMOS bulk transistor device, for example. Alternatively, a layer of oxide material 170 having a thickness of about 70 Angstroms or less can be formed to serve as a gate oxide in a low voltage CMOS bulk transistor device, for example.

A gate polysilicon layer 172 is then deposited over the layer of gate oxide material 170. The polysilicon layer 172 can, for example, be formed to between about 800 to about 5000 Angstroms, and may include a dopant, such as a p-type dopant (Boron) or n-type dopant (e.g., Phosphorus), depending upon the type(s) of transistors to be formed. The dopant can be in the polysilicon 172 as originally applied, or may be subsequently added thereto (e.g., via a doping process). The gate oxide 170 and gate polysilicon 172 layers are then patterned to form the gate structure 160, which comprises a gate dielectric and a gate electrode, and which is situated over a channel region 174 in the epi and silicon regions 118, 134.

With the patterned gate structure formed, LDD, MDD, or other extension implants (not shown) can be performed, for example, depending upon the type(s) of transistors to be formed, and left and right sidewall spacers 178a, 178b can be formed along left and right lateral sidewalls of the patterned gate structure 160. Implants to form the source (S) region 164 and the drain (D) region 166 are then performed, wherein any suitable masks and implantation processes may be used in forming the source and drain regions 164, 166 to achieve desired transistor types. For example, a PMOS well mask can be utilized to define n-type wells for the bulk PMOS transistor areas and a PMOS source/drain mask may be utilized to define one or more openings through which a p-type source/drain implant (e.g., Boron (B and/or $BF_2$)) is performed to form p-type source and drain regions for PMOS bulk transistor devices. Similarly, an NMOS well mask can be utilized to define p-type wells for the bulk NMOS transistor areas and an NMOS source/drain mask may be employed to define one or more openings through which an n-type source/drain implant (e.g., Phosphorous (P) and/or Arsenic (As)) is performed to form n-type source and drain regions for NMOS bulk transistor devices. Depending upon the types of masking techniques employed, such implants may also selectively dope the poly-silicon 172 of the gate structure 160 of certain transistors, as desired. It will be appreciated that the channel region 174 is thus defined between the source and drain regions 164, 166 in the different transistors.

Accordingly, forming transistors according to one or more aspects of the present invention allows fully-depleted silicon-on-insulator (FD-SOI) and bulk transistor devices to be fabricated in a single integrated circuit fabrication process. Forming the different types of transistors on the same semiconductor substrate allows their respective advantages to be integrated to satisfy different circuit application requirements. For example, FD-SOI transistors can be used where speed and low threshold voltages (Vt's) are important. NMOS and/or PMOS transistors can, for example, be formed in the fully depleted areas 134 for high speed CMOS applications. Likewise, transistors having a high threshold voltage (Vt), transistors having a low threshold voltage, high performance CMOS transistors, transistors that are to be used for memory applications and/or transistors that are to be used for analog applications can formed in the bulk or epi regions 118. Additionally, forming transistors as disclosed herein also allows capacitors to be formed as part of the fabrication process. For example, a capacitor can be fashioned from the layer of gate polysilicon material 172, the layer of gate oxide material 170 and the substrate 104, for example. Similarly, resistors can be built in the substrate 104, and bipolar transistors can also be fabricated as part of the process.

It will be appreciated that while reference is made throughout this document to exemplary structures in discussing aspects of methodologies described herein (e.g., those structures presented in FIGS. 2-11 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs.

It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a fully-depleted silicon-on-insulator (FD-SOI) transistor and a bulk transistor as part of an integrated circuit fabrication process, comprising:
   providing a silicon-on-insulator (SOI) substrate which comprises a layer of silicon material formed over a layer of insulating material which is in turn formed over a semiconductor substrate;
   forming a layer of oxide material over the layer of silicon material;
   forming a layer of nitride material over the layer of oxide material;
   patterning the layer of nitride material, the layer of oxide material, the layer of silicon material and at least some of the layer of insulating material to establish bulk regions wherein bulk transistors can be formed, and where the bulk regions separate the layer of silicon into silicon regions wherein fully depleted transistors can be formed;
   removing the layer of nitride material;
   growing an epitaxial material in the bulk regions;
   removing the layer of oxide material;
   thinning the silicon regions by growing a layer of oxide material which consumes silicon as part of the growth process;
   removing the grown layer of oxide material to reveal the thinned silicon regions; and
   forming a fully depleted transistor in a thinned silicon region and forming a bulk transistor in a bulk region.

2. The method of claim 1, wherein growing the layer of oxide material also consumes epi material as part of the growth process such that the bulk regions and the thinned silicon regions are substantially flush when the grown layer of oxide material is removed.

3. The method of claim 2, further comprising:
   forming an oxide over exposed portions of the layer of silicon after the layer of silicon is patterned in forming the bulk regions.

4. The method of claim 2, further comprising:
   recessing the exposed portions of the layer of silicon before forming the oxide over the exposed portions.

5. The method of claim 2, wherein the layer of oxide material is formed to thickness of around 50 to 200 Angstroms.

6. The method of claim 2, wherein the layer of nitride material is formed to thickness of between around 700 Angstroms and around 1200 Angstroms.

7. The method of claim 2, wherein the layer of silicon material is formed to a thickness of between around 800 Angstroms and around 1200 Angstroms.

8. The method of claim 2, wherein the layer of silicon material is thinned down so as to have a thickness of between around 20 Angstroms and around 40 Angstroms in the silicon regions.

9. The method of claim 1, further comprising:
   removing excess epitaxial material that grows up out of the bulk regions.

10. The method of claim 1, wherein the grown layer of oxide material is removed with a hydrogen fluoride (HF) based substance.

11. The method of claim 1, wherein forming the fully depleted transistor comprises forming a fully depleted gate structure over the thinned silicon region and forming a source region within the thinned silicon region adjacent to one side of the fully depleted gate structure and forming a drain region within the thinned silicon region adjacent to the other side of the fully depleted gate structure, and forming the bulk transistor comprises forming a bulk gate structure over the bulk region and forming a source region within the bulk region adjacent to one side of the bulk gate structure and forming a drain region within the bulk region adjacent to the other side of the bulk gate structure.

12. The method claim 11, wherein the fully depleted gate structure comprises a gate dielectric and a gate electrode, and the bulk gate structure comprises a gate dielectric and a gate electrode.

13. A method of forming a fully-depleted silicon-on-insulator (FD-SOI) transistor and a bulk transistor as part of an integrated circuit fabrication process, comprising:
   providing a silicon-on-insulator (SOI) substrate which comprises a layer of silicon material formed over a layer of insulating material which is in turn formed over a semiconductor substrate;
   etching at least the layer of silicon material to form first and second cross sectional sidewalls therein;
   forming an insulation layer over the first and second cross sectional sidewalls;
   converting at least some of the SOI substrate into a bulk semiconductor substrate;
   thinning at least some of the silicon of the remaining SOI substrate into a bulk semiconductor substrate; and
   forming a fully depleted transistor in an area of thinned silicon and forming a bulk transistor in an area of the bulk semiconductor substrate.

14. The method of claim 13, wherein converting at least some of the SOI substrate into a bulk semiconductor substrate comprises:
   during the etching of at least the layer of silicon material, etching the layer of silicon material and at least some of the layer of insulating material to establish bulk regions therein; and
   growing an epitaxial material in the bulk regions.

15. The method of claim 14, wherein thinning the silicon comprises:
   growing a layer of oxide material which consumes silicon as part of the growth process; and
   removing the grown layer of oxide material to reveal the thinned silicon.

16. The method of claim 13, wherein the silicon is thinned down to a thickness of between around 20 Angstroms and around 40 Angstroms.

17. The method of claim 15, wherein the grown layer of oxide material is removed with a hydrogen fluoride (HF) based substance.

18. The method of claim 14, further comprising oxidizing the first and second cross sectional sidewalls to form the insulation layer, wherein the insulation layer electrically isolates the epitaxial material in the bulk regions from the layer of silicon material.

* * * * *